United States Patent
Manku et al.

(10) Patent No.: US 8,004,326 B2
(45) Date of Patent: Aug. 23, 2011

(54) DIGITAL CHARGE PUMP PLL ARCHITECTURE

(75) Inventors: Tajinder Manku, Waterloo (CA); Christopher Snyder, Waterloo (CA)

(73) Assignee: Icera Canada ULC, Calgary (CA)

( * ) Notice: Subject to any disclaimer, the term of this patent is extended or adjusted under 35 U.S.C. 154(b) by 0 days.

(21) Appl. No.: 12/515,562

(22) PCT Filed: Dec. 13, 2007

(86) PCT No.: PCT/CA2007/002247
§ 371 (c)(1),
(2), (4) Date: May 20, 2009

(87) PCT Pub. No.: WO2008/074129
PCT Pub. Date: Jun. 26, 2008

(65) Prior Publication Data
US 2010/0060333 A1 Mar. 11, 2010

Related U.S. Application Data

(60) Provisional application No. 60/871,266, filed on Dec. 21, 2006.

(51) Int. Cl.
*H03L 7/06* (2006.01)
(52) U.S. Cl. ......................................... 327/156; 327/147
(58) Field of Classification Search .................. 327/147, 327/156
See application file for complete search history.

(56) References Cited

U.S. PATENT DOCUMENTS

| | | | |
|---|---|---|---|
| 5,739,725 A * | 4/1998 | Ferraiolo et al. | 331/57 |
| 6,313,707 B1 | 11/2001 | Fischer et al. | |
| 6,538,475 B1 * | 3/2003 | Johansen et al. | 327/12 |
| 7,256,630 B2 * | 8/2007 | Takase | 327/157 |
| 7,268,629 B2 * | 9/2007 | Takase | 331/1 A |
| 7,382,169 B2 * | 6/2008 | Nikolov et al. | 327/156 |
| 7,403,073 B2 * | 7/2008 | Kossel et al. | 331/16 |
| 7,605,664 B2 * | 10/2009 | Sandner et al. | 331/16 |
| 7,633,322 B1 * | 12/2009 | Zhuang et al. | 327/156 |
| 7,733,985 B2 * | 6/2010 | Chang | 375/327 |
| 2005/0195002 A1 * | 9/2005 | Puccio et al. | 327/157 |
| 2006/0164174 A1 | 7/2006 | Molina et al. | |
| 2006/0267642 A1 * | 11/2006 | Takase | 327/156 |
| 2007/0075785 A1 * | 4/2007 | Kossel et al. | 331/16 |
| 2007/0200638 A1 * | 8/2007 | Sandner et al. | 331/16 |
| 2010/0141308 A1 * | 6/2010 | Villarino-Villa et al. | 327/141 |
| 2010/0241918 A1 * | 9/2010 | Nedovic | 714/746 |

OTHER PUBLICATIONS

Abstract of JP5218856, published Aug. 27, 1993, Hiroyuki et al.
International Application Serial No. PCT/CA2007/002247, International Search Report dated Apr. 10, 2008.

* cited by examiner

*Primary Examiner* — Lincoln Donovan
*Assistant Examiner* — Adam D Houston
(74) *Attorney, Agent, or Firm* — Shin Hung; Borden Ladner Gervais LLP (57) ABSTRACT

A digital phase lock loop (PLL) circuit having a digital charge pump circuit for providing digital signals corresponding to a difference in phase between an internal clock corresponding to a voltage controlled oscillator, and a reference clock. These digital signals are processed by a digital processing circuit for providing digital control signals. Some of the digital control signals are converted into an analog control signal to provide fine control of the voltage controlled oscillator, while the remaining digital control signals provide coarse control of the voltage controlled oscillator.

22 Claims, 11 Drawing Sheets

DIGITAL CHARGE PUMP PLL ARCHITECTURE

CROSS REFERENCE TO RELATED APPLICATIONS

This application claims the benefit of priority of U.S. Provisional Patent Application No. 60/871,266 filed on Dec. 21, 2006, which is incorporated herein by reference in its entirety.

FIELD OF THE INVENTION

The present invention relates generally to phase lock loops for radio applications. In particular, the present invention relates to charge pump circuits for phase lock loops.

BACKGROUND OF THE INVENTION

Figure 1:
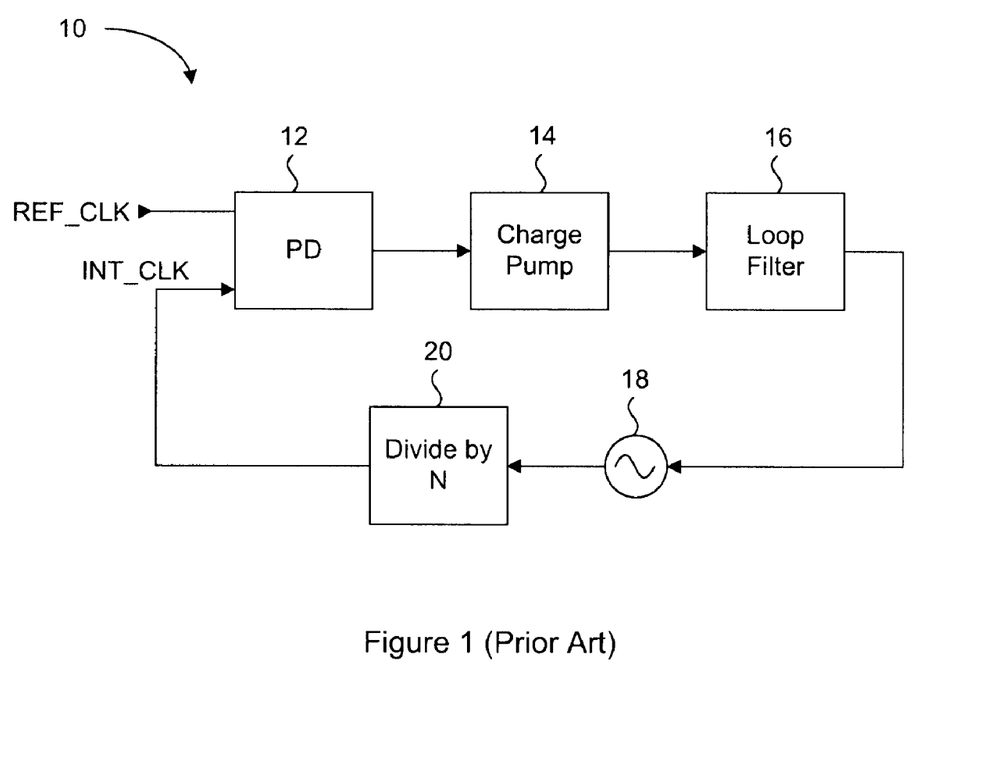
FIG. 1 is a block diagram of a PLL circuit of the prior art.

Phase lock loops (PLL) are commonly used in radio communication applications for generating stable frequencies in circuits such as RF transceivers. A PLL is a closed system which uses feedback to generate a frequency signal that is locked to a reference clock signal. FIG. 1 is a general block diagram of a well known PLL circuit.

In FIG. 1, PLL 10 will lock its internal frequency, ie. INT_CLK to a reference signal REF_CLK. PLL 10 includes a phase detector 12, a charge pump 14, a loop filter 16, a voltage controlled oscillator (VCO) 18 and a divider circuit 20. In general operation, the phase detector 12 compares the phase of the reference signal REF_CLK to the internally generated signal INT_CLK, and the charge pump 14 will generate the appropriate signals for controlling VCO 18. Eventually, convergence is reached and the INT_CLK will lock with REF_CLK. The function of the circuits of PLL 10 shown in FIG. 1 are well known in the art.

Most PLL circuits are predominantly implemented with analog circuits, and have the loop filter implemented off chip. In the PLL 10 of FIG. 1, all the components are analog with the exception of the phase detector 12 and the divider circuit 20. The loop filter 16 can be implemented digitally, thereby allowing it to be integrated on-chip with the other components. The VCO 18 preferably remains an analog circuit to provide accurate control over the output frequency signal, in response to an analog voltage signal. Therefore, the charge pump 14 should provide an analog signal for controlling the VCO 18. An example charge pump 14 is shown in FIG. 2 to illustrate how this analog signal is generated.

Figure 2:
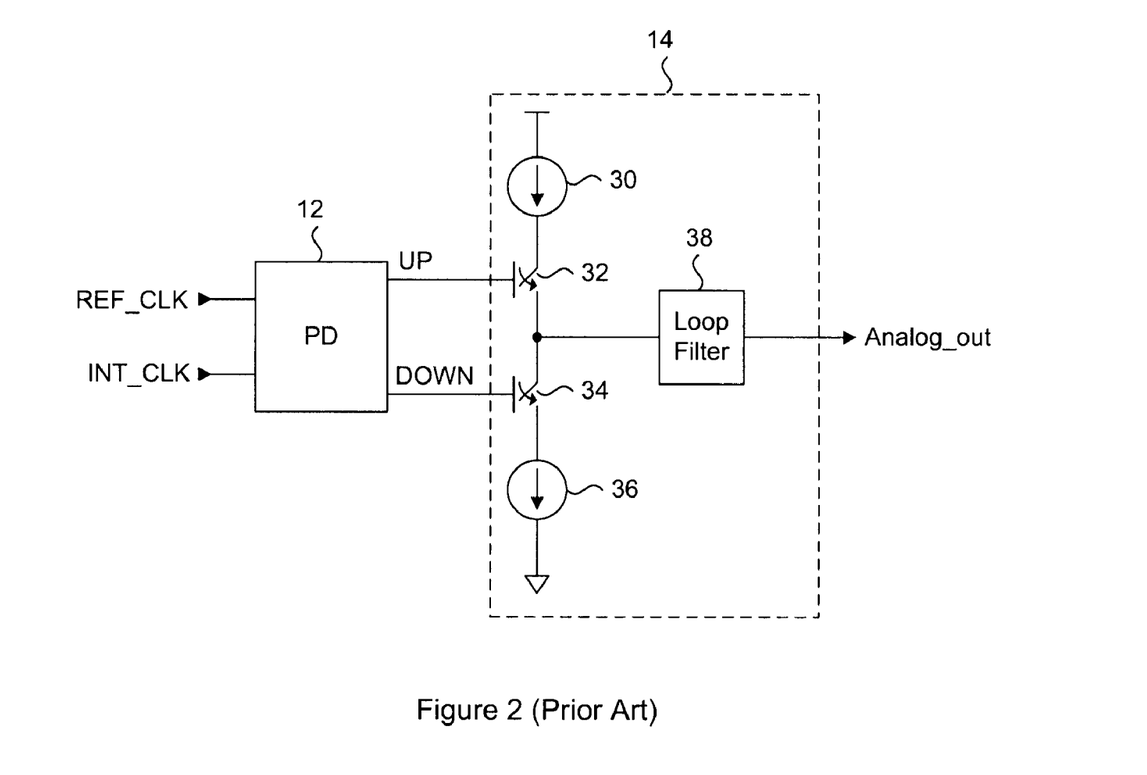
FIG. 2 is a circuit schematic of the phase detector used in the PLL circuit of FIG. 1.
Figure 3A:
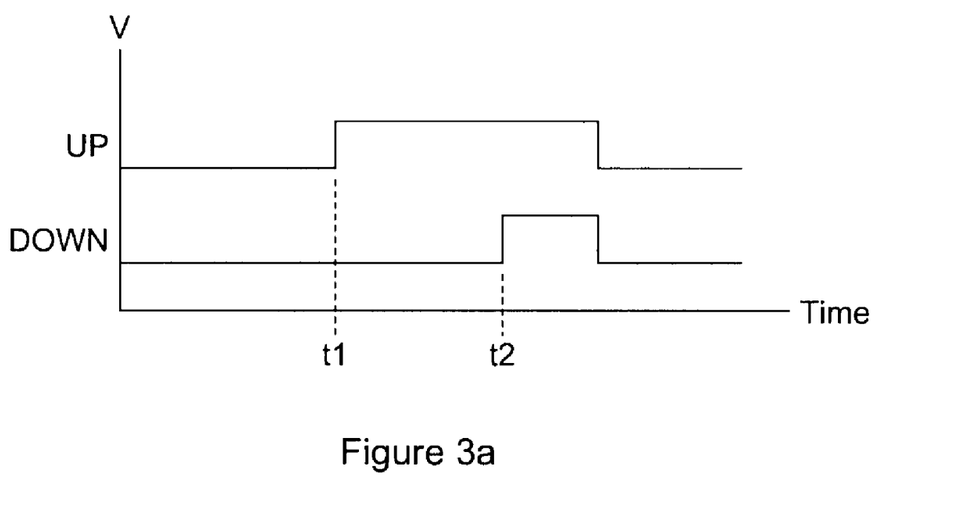
FIGS. 3a and 3b are timing diagrams illustrating the operation of the phase detector shown in FIG. 2.
Figure 3B:
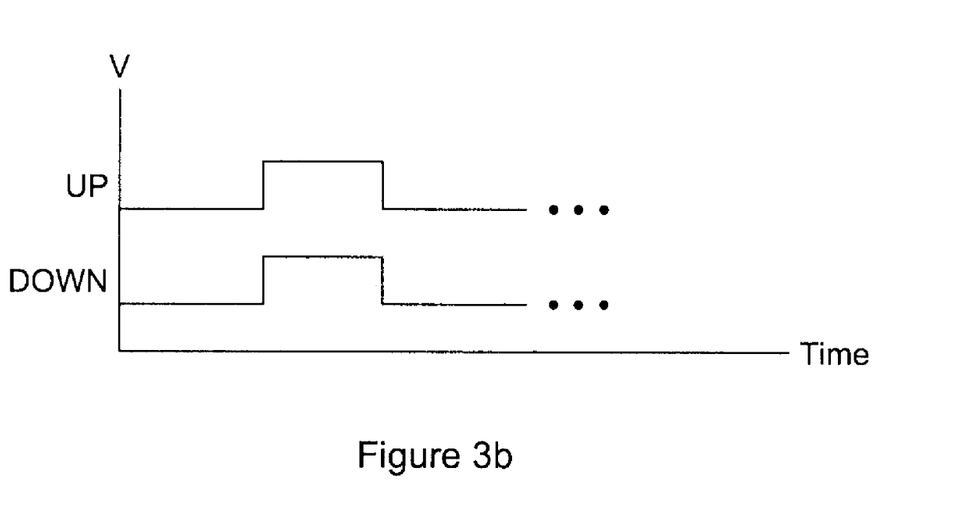

FIG. 2 shows the phase detector 12 coupled to the charge pump 14. Phase detector 12 compares the phase of REF_CLK to INT_CLK, and generates digital pulses UP and DOWN. The duration of the UP and DOWN pulses indicates a difference in phase between the two clock signals. The charge pump 14 has a first current source 30, switch 32, switch 34, and second current source 36, all connected in series between the high voltage supply and ground. It is assumed that the first and second current sources 30 and 36 are identical. Signal Analog_out is provided from the common terminal of switches 32 and 34, to which is connected a loop filter 38. The frequency of VCO 18 is adjusted via signal Analog_out, which itself is adjusted by the duration each switch 32 and 34 is turned on. FIG. 3a shows example signal traces for signals UP and DOWN. Signal UP rises to the high logic level at time t1 to turn on switch 32 to increase the voltage level of Analog_out via loop filter 38. At time t2, signal DOWN rises to the high logic level to turn on switch 34. Therefore, the net current being applied to loop filter 38 is zero and the adjustment to Analog_out stops. Eventually, both UP and DOWN will have substantially the same pulse duration, as shown in FIG. 3b, meaning that INT_CLK has locked to REF_CLK.

A significant disadvantage to having a PLL implemented with too many analog circuits is that the analog circuits do not scale well with each process technology generation. For example, analog circuits designed for a 90 nm fabrication process technology will not work as designed if the same circuits are fabricated in a 65 nm fabrication process technology. Digital circuits on the other hand, scale well with process technology, thereby simplifying design iteration and reducing overall cost when a circuit design is ported to the next technology.

It is, therefore, desirable to provide a PLL circuit which maximizes digital circuit content, and has a digitally implemented charge pump circuit for controlling the VCO.

SUMMARY OF THE INVENTION

It is an object of the present invention to obviate or mitigate at least one disadvantage of previous PLL circuits. In particular, it is an object of the present invention to provide a PLL circuit having a digital charge pump circuit, which enables digital implementation of downstream circuits.

In a first aspect, the present invention provides a digital phase lock loop circuit. The digital phase lock loop circuit includes a voltage controlled oscillator, a divider, a digital charge pump circuit and a digital processing circuit. The voltage controlled oscillator provides an output clock signal having a first frequency in response to control signals. The divider converts the output clock signal into an internal clock signal having a second frequency. The digital charge pump circuit generates a phase offset word corresponding to a difference in phase between the internal clock signal and a reference clock signal. The digital processing circuit receives the phase offset word and generates the control signals in response to the phase offset word. In an embodiment of the first aspect, the digital charge pump circuit includes a quantizing circuit for generating the phase offset word in response to a phase difference between active edges of the internal clock signal and the reference clock signal.

In a further aspect of the present embodiment, the quantizing circuit includes a first phase offset quantizer and a second phase offset quantizer. The first phase offset quantizer has a first sampling input for receiving a first signal corresponding to the reference clock signal and a first latch input for receiving a second signal corresponding to the internal clock signal. The first phase offset quantizer digitizes the first signal received at the sampling input into a first sub-word in response to an active edge of the second signal. The second phase offset quantizer has a second sampling input for receiving the second signal and a second latch input for receiving the first signal. The second phase offset quantizer digitizes the second signal received at the sampling input into a second sub-word in response to an active edge of the first signal, the phase offset word corresponding to the first sub-word and the second sub-word. In the present embodiment, the digital charge pump circuit includes a phase frequency detector. The phase frequency detector provides the first signal from a first output terminal in response to the reference clock signal and the second signal from a second output terminal in response to the internal clock signal. The first signal has an active edge corresponding to an active edge of the reference clock signal, and the second signal has an active edge corresponding to an active edge of the internal clock signal.

In yet another embodiment of the first aspect, the digital charge pump includes a phase frequency detector for providing the first signal from a first output terminal and the second signal from a second output terminal. The phase frequency detector includes logic circuitry for driving the first signal to an active logic level in response to an earliest active edge between the reference clock signal and the internal clock signal, where the first signal is driven to an inactive logic level in response to a latest active edge between the reference clock signal and the internal clock signal. The difference in time between the earliest active edge and the latest active edge corresponds to the phase difference between the internal clock signal and the reference clock signal. In the present embodiment, the logic circuitry includes an XOR gate and an inverter. The XOR gate has a first input for receiving the reference clock signal, a second input for receiving the internal clock signal, and a first output corresponding to the first output terminal. The inverter has a third input connected to the first output and a second output corresponding to the second output terminal. According to aspects of the present embodiment, a lag direction circuit is included for providing data corresponding to a lag of the reference clock signal relative to the internal clock signal, and the quantizing circuit includes a phase offset quantizer having a sampling input for receiving the first output and a latch input for receiving the second output, the phase offset quantizer digitizing the first output received at the sampling input into the phase offset word in response to the second output.

In a further embodiment, the logic circuitry includes a phase detector, an XOR gate, and an inverter. The phase detector has the first output terminal for providing the first signal in response to the reference clock signal, and has the second output terminal for providing the second signal in response to the internal clock signal. The first signal has an active edge corresponding to an active edge of the reference clock signal, and the second signal has an active edge corresponding to an active edge of the internal clock signal. The XOR gate has a first input for receiving the first signal, a second input for receiving the second signal, and a first output corresponding to the first output terminal. The inverter has a third input connected to the first output and a second output corresponding to the second output terminal.

In a second aspect, the present invention provides a digital charge pump circuit. The digital charge pump circuit includes a quantizing circuit and a phase frequency detector. The quantizing circuit generates a phase offset word in response to a phase difference between active edges of a first signal and a second signal. The phase frequency detector provides the first signal from a first output terminal in response to a reference clock and the second signal from a second output terminal in response to an internal clock. The first signal has an active edge corresponding to an active edge of the reference clock, and the second signal has an active edge corresponding to an active edge of the internal clock. The first signal can be a charge up pulse and the second signal is a charge down pulse, the charge up pulse and the charge down pulse being generated by a phase frequency detector circuit. Alternately, the first signal is provided from an XOR gate receiving a reference clock and an internal clock, and the second signal is a complement of the first signal. Alternately, the first signal is a reference clock and the second signal is an internal clock. Alternately, the quantizing circuit includes a synchronizer for receiving the phase offset word and for providing the phase offset word synchronously with a clock signal.

According to an embodiment of the present aspect, the phase frequency detector includes a first latch, a second latch and a logic circuit. The first latch drives the first signal to an active logic level in response to the active edge of the reference clock. The second latch drives the second signal to the active logic level in response to the active edge of the internal clock. The logic circuit resets the first latch and the second latch when both the first signal and the second signal are at the active logic level. The logic circuit can include a delay circuit for delaying resetting of the first latch and the second latch for a predetermined period of time. In another embodiment of the present aspect, a phase frequency detector is included for providing the first signal from a first output terminal and the second signal from a second output terminal, and the phase frequency detector includes logic circuitry for driving the first signal to an active logic level in response to an earliest active edge between a reference clock and an internal clock. The first signal is driven to an inactive logic level in response to a latest active edge between the reference clock and the internal clock. The logic circuitry includes an XOR gate and an inverter. The XOR gate has a first input for receiving the reference clock, a second input for receiving the internal clock, and a first output corresponding to the first output terminal. The inverter has a third input connected to the first output and a second output corresponding to the second output terminal. A lag direction circuit is included for providing data corresponding to a lag of the reference clock relative to the internal clock. The lag direction circuit includes a delay circuit and a third latch. The delay circuit receives one of the reference clock and the internal clock, and provides a delayed clock signal. The third latch latches the delayed clock signal in response to the second output being at the active logic level when both the internal clock and the reference clock are at the active logic level.

In yet another embodiment of the second aspect, the logic circuitry includes a phase detector, an XOR gate and an inverter. The phase detector has the first output terminal for providing the first signal in response to the reference clock signal, and has the second output terminal for providing the second signal in response to the internal clock signal. The first signal has an active edge corresponding to an active edge of the reference clock signal, and the second signal has an active edge corresponding to an active edge of the internal clock signal. The XOR gate has a first input for receiving the first signal, a second input for receiving the second signal, and a first output corresponding to the first output terminal. The inverter has a third input connected to the first output and a second output corresponding to the second output terminal. The lag direction circuit includes a delay circuit and third latch. The delay circuit receives one of the first signal and the second signal and provides a delayed clock signal. The third latch latches the delayed clock signal in response to the second output being at the active logic level when both the first signal and the second are at the active logic level.

In further embodiments of the second aspect, the quantizing circuit includes a phase offset quantizer having a sampling input for receiving the first output and a latch input for receiving the second output, the phase offset quantizer quantizing the first output received at the sampling input into the phase offset word in response to the second output. Alternately, the quantizing circuit includes a first phase offset quantizer and a second phase offset quantizer. The first phase offset quantizer has a first sampling input for receiving the first signal and a first latch input for receiving the second signal. The first phase offset quantizer quantizing the first signal received at the sampling input into a first sub-word in response to an active edge of the second signal. The second phase offset quantizer has a second sampling input for receiving the second signal and a second latch input for receiving the first signal. The second phase offset quantizer quantizing the second signal received at the sampling input into a second sub-word in response to an active edge of the first signal, where the phase offset word corresponds to the first sub-word and the second sub-word.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described by way of example only with reference to the attached Figures, in which:

FIG. 7b is a timing diagram showing the operation of the phase frequency detector of FIG. 7a;

FIG. 9b is a timing diagram showing the operation of the digital charge pump of FIG. 9a;

FIG. 10a is a circuit schematic of the digital charge pump of FIG. 9a with a modified phase frequency detector, according to an alternate embodiment of the present invention; and, FIG. 10b is a timing diagram showing the operation of the digital charge pump of FIG. 10a.

DETAILED DESCRIPTION

Generally, the present invention provides a digital phase lock loop (PLL) circuit having a digital charge pump circuit for providing digital signals corresponding to a difference in phase between an internal clock corresponding to a voltage controlled oscillator, and a reference clock. These digital signals are processed by a digital processing circuit for providing digital control signals. The digital control signals are converted into one or more corresponding analog control signals for controlling the output frequency of the voltage controlled oscillator. All the components of the digital PLL circuit are integrated on the same chip, and the digital processing circuit provides loop filter functionality in addition to further signal processing functions.

Figure 4:
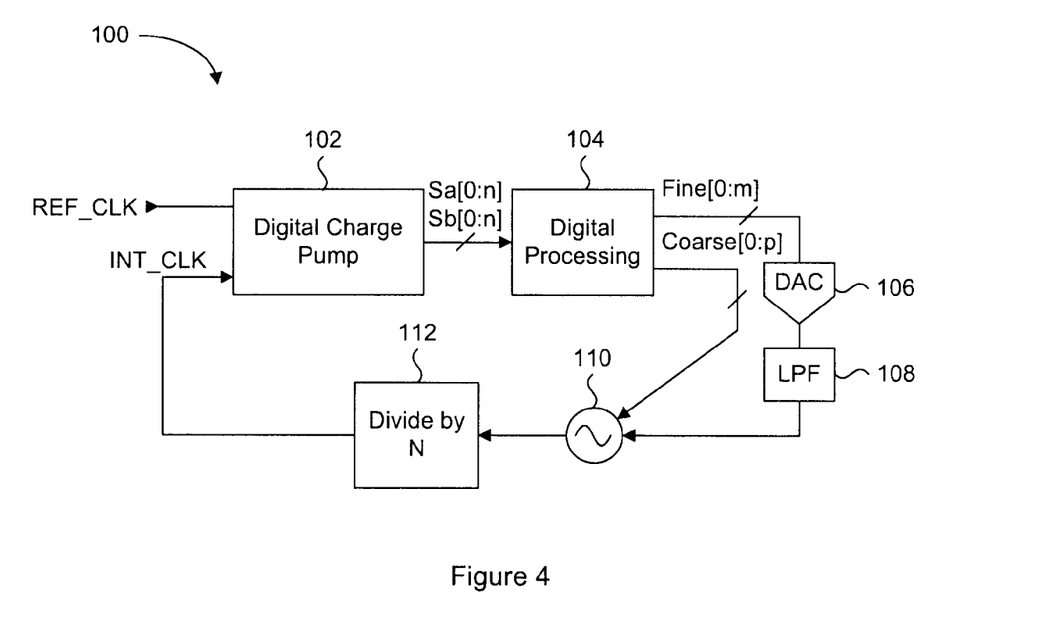
FIG. 4 a block diagram of a digital PLL circuit according to an embodiment of the present invention.

FIG. 4 is a schematic of a digital PLL circuit according to an embodiment of the present invention. Digital PLL circuit 100 includes a digital charge pump circuit 102, a digital processing circuit 104, a digital to analog converter 106, a low pass filter 108, a voltage controlled oscillator (VCO) 110, and a divider circuit 112. With the exception of the VCO 110, all the remaining circuits of digital PLL circuit 100 are digital circuits. Following will be a discussion of the components of digital PLL circuit 100.

The digital charge pump circuit 102 is responsible for determining the phase difference between the reference clock REF_CLK and the internal clock signal INT_CLK corresponding to the VCO 110. The digital charge pump circuit 102 will provide a phase offset word corresponding to this difference in phase between the two received signals. When comparing the phase of two signals relative to each other, the first lags the second or the second lags the first. For example, a rising edge of one signal can occur either before or after the rising edge of the other signal. Hence in the present embodiment of FIG. 4, the phase offset word will include two sub-words. The first sub-word is Sa[0:n] and the second sub-word is Sb[0:n], where n is any non-zero integer value. The selection of n depends on a resolution of digital charge pump circuit 102, as will be described later. The first sub-word Sa[0:n] can represent the amount of time INT_CLK lags REF_CLK, while the second sub-word Sb[0:n] can represent the amount of time REF_CLK lags INT_CLK.

The phase offset word is then provided to digital processing circuit 104, which provides loop filtering functionality. Furthermore, digital processing circuit 104 will be pre-programmed to assess the phase offset word and generate corresponding digital control signals, such as fine control word Fine[0:m] and coarse control word Coarse[0:p] in the present embodiment, where m and p can be the same or different non-zero integer values. During initial start up of the digital PLL circuit 100, the digital control signals will be set to a default value, which is then adjusted during each iteration of the loop. Those skilled in the art will understand that there are a variety of techniques for determining the value of the coarse and fine control words. Since the phase offset word corresponds to a difference in time between active edges of two signals, the digital processing circuit 104 can be pre-programmed to mathematically determine the appropriate coarse control word for making large adjustments to the VCO 110, and the appropriate fine control word for making small adjustments to the VCO 110. The coarse and fine control of VCO 110 can be calibrated to the phase offset words.

The coarse control word Coarse[0:p] is fed directly to VCO 110, for digitally controlling a parameter of VCO 110. For example, each bit of Coarse[0:p] can be used to control on capacitor of an array of switched capacitors. The use of an array of switched capacitors for controlling a VCO 110 is well known in the art. Each capacitor element can have the same capacitance or different capacitances. The digital processing circuit 104 will be pre-programmed to generate the appropriate coarse control word based on the specific capacitor array configuration. The fine control word is received by digital to analog (DAC) 106, which converts it into an analog voltage control signal. This analog voltage control signal is passed through low pass filter 108 to remove any quantization noise due to the digital to analog conversion process executed by DAC 106. The filtered analog voltage control signal is then received by VCO 110, which will have the necessary input terminal for further adjusting its output frequency. In alternate embodiments, digital processing circuit 104 does not provide separate coarse and fine control words, and instead provides one control word. This control word would be provided to DAC 106 for conversion into the analog voltage control signal, which is subsequently used to exclusively control VCO 110.

In response to the coarse and fine control words, and intermediate analog voltage control signal, VCO 110 will adjust the frequency of its output clock signal, which is received by divider circuit 112, which converts the output clock signal frequency into the internal clock signal INT_CLK.

As shown in FIG. 4, digital PLL circuit 100 embodiment controls an analog VCO 110 using digital control signals, which are themselves generated in response to a digital phase offset word. Now the generation of the digital phase offset word, according to one embodiment of the present invention will be discussed with reference to the circuit of FIG. 5.

Figure 5:
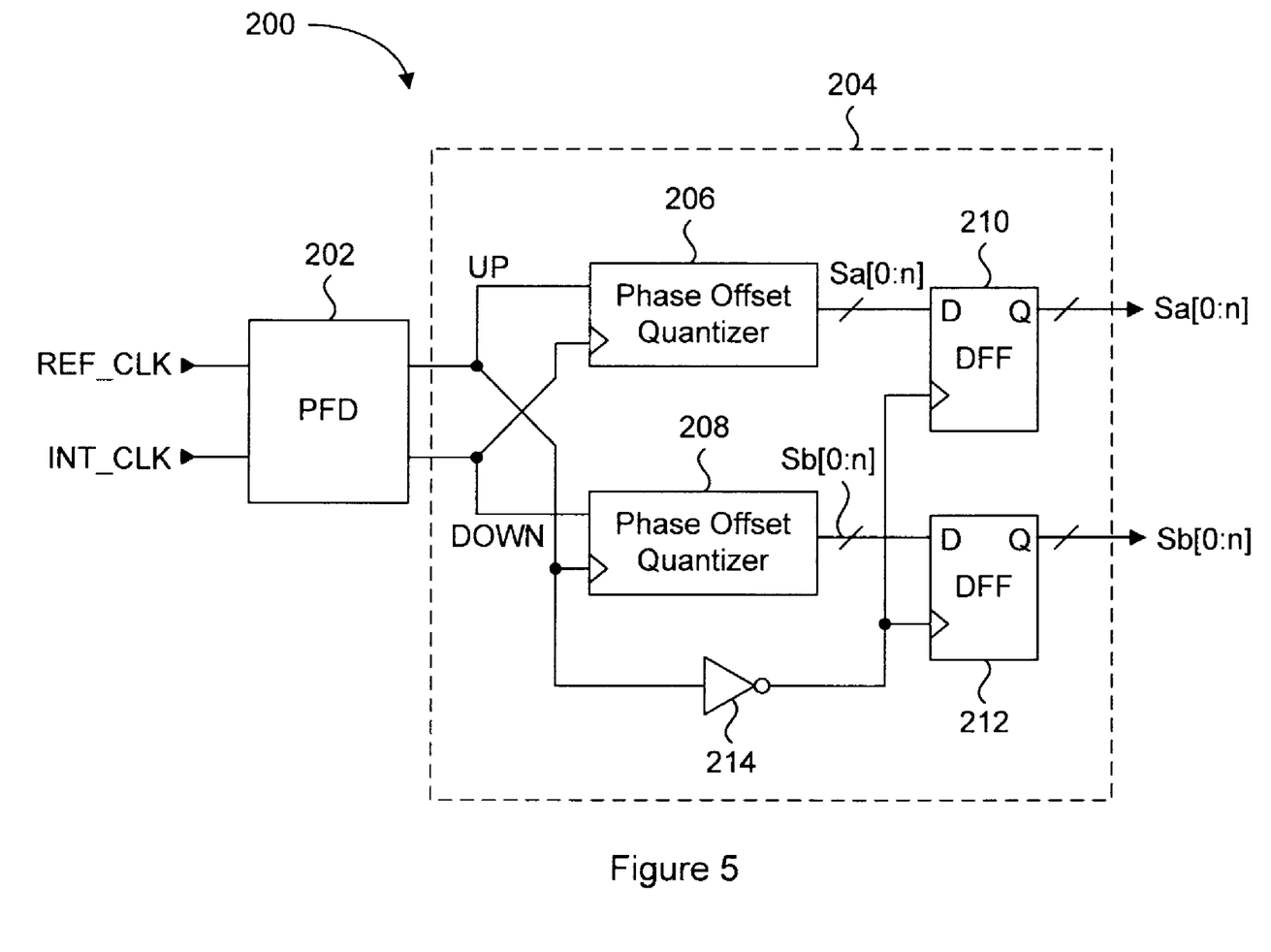
FIG. 5 is a schematic of a digital charge pump according to an embodiment of the present invention.

FIG. 5 is a schematic of a digital charge pump according to an embodiment of the present invention. The digital charge pump will generate a phase offset word that corresponds to a difference in time between active edges of two input signals. An active edge can be a rising edge or a falling edge of a signal. Digital charge pump 200 includes a phase frequency detector 202 and a quantizing circuit 204. The phase frequency detector 202 receives REF_CLK and INT_CLK, for generating a first signal from a first output terminal and a second signal from a second output terminal. The first signal is a charge up pulse UP while the second signal is a charge down pulse DOWN. The charge up pulse UP and charge down pulse DOWN will have active edges corresponding substantially in time to the active edges of REF_CLK and INT_CLK respectively, and pulse durations preset by logic within phase frequency detector 202.

The quantizing circuit 204 receives the UP and DOWN pulses and generates the phase offset word consisting of sub-words Sa[0:n] and Sb[0:n], in response to the difference in time between the active edges of the UP and DOWN pulses. Implementation details of the quantizing circuit 204 according to the present embodiment are now discussed.

The quantizing circuit 204 includes a first phase offset quantizer 206, a second phase offset quantizer 208, and a synchronizer consisting of latches 210 and 212. Both phase offset quantizers 206 and 208 have sampling inputs for receiving the charge up pulse UP and the charge down pulse DOWN respectively, and a latch input for receiving charge down pulse DOWN and charge up pulse UP respectively. In an alternate embodiment, phase frequency detector 202 is not used, and REF_CLK will be connected directly to the sampling input of phase offset quantizer 206 and to the latch input of phase offset quantizer 208. Signal IN_CLK will then be connected directly to the sampling input of phase offset quantizer 208 and to the latch input of phase offset quantizer 206.

Figure 6A:
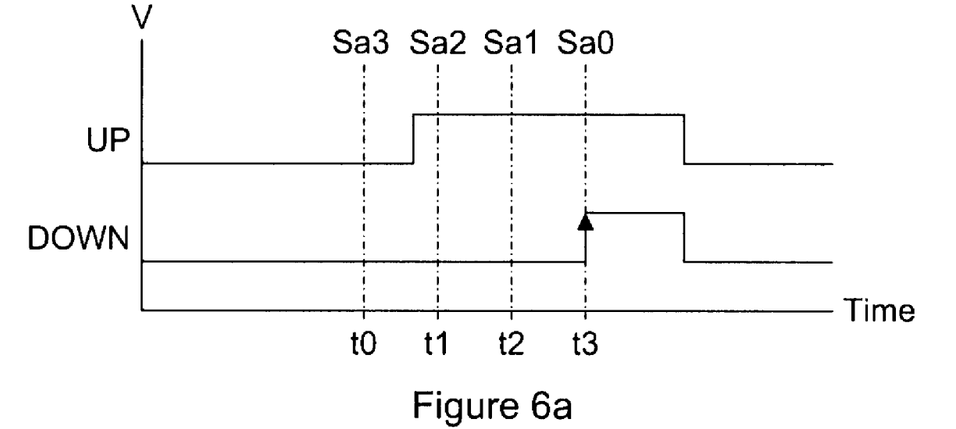
FIGS. 6a and 6b are timing diagrams showing the operation of the digital charge pump of FIG. 5.
Figure 6B:
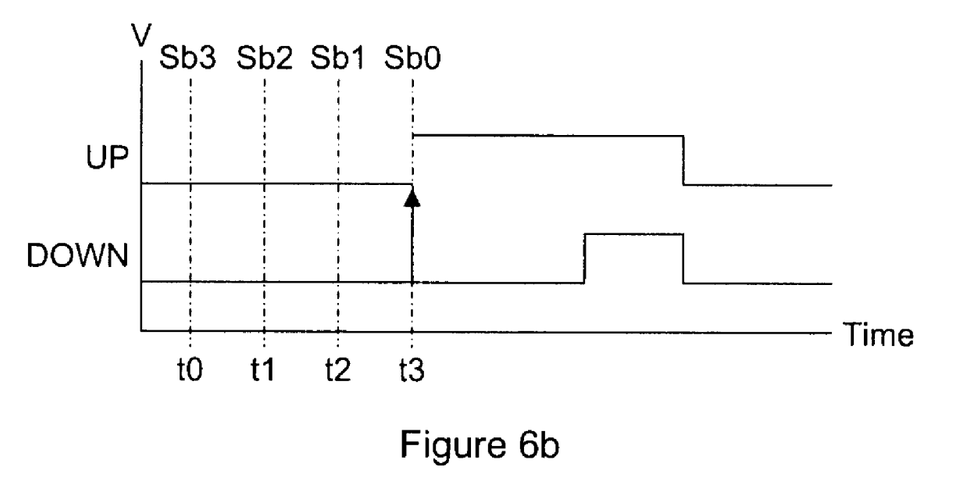

Each phase offset quantizer will quantize the state of the signal received at its sampling input for a specific period of time, and generates a sub-word of a predetermined number of bits corresponding thereto. The time at which the quantization occurs depends on when the latch input receives an active edge. The signal input configuration of the phase offset quantizers 206 and 208 enables them to be self-latching, in that the moment of quantization of one signal is driven by the other. FIGS. 6a and 6b are timing diagrams illustrating example operation of phase offset quantizers 206 and 208.

FIG. 6a is an example timing diagram showing the operation of phase offset quantizer 206. In the present example, charge up pulse UP has an active edge occurring before charge down pulse DOWN. On the active edge of DOWN, phase offset quantizer 206 will quantize UP for a predetermined time, which will be between t0 and t3. If the quantization resolution is n=0 to 3, sampling will occur at t0, t1, t2 and t3. In FIG. 6a, Sa0=logic "1", Sa1=logic "1", Sa2=logic "1" and Sa3=logic "0", which corresponds to the time lag of UP relative to DOWN. If charge up pulse UP had an active edge occurring after charge down pulse DOWN, phase offset quantizer 206 would not capture any information relating to the difference in phase since the UP active edge has passed before latching on the active edge of DOWN has occurred. It is for this reason that the phase offset quantizer 208 is required. To illustrate this situation, FIG. 6b is a timing diagram showing the operation of phase offset quantizer 208 using the first example shown in FIG. 6a. As phase offset quantizer 208 latches on the active edge of UP, sampling will occur at t0, t1, t2 and t3. In FIG. 6b, Sb0=logic "0", Sb1=logic "0", Sb2=logic "0" and Sb3=logic "0", which corresponds to the time lag of DOWN relative to UP. Since all logic states are "0", this is interpreted to mean that DOWN is ahead of UP.

Therefore, when the digital PLL circuit 100 is in the process of locking INT_CLK to REF_CLK, there are two general situations that can occur; INT_CLK will lag behind REF_CLK or INT_CLK will be ahead of REF_CLK. Hence, two parameters are being determined with the two sub-words. First is the magnitude of the phase difference between the two signals, and second is the direction of the phase difference between the two signals. By having this information, the digital processing circuit 104 will be able to generate the appropriate compensation signals for adjusting the VCO 110 to lock with REF_CLK.

As shown in FIGS. 6a and 6b, sub-words Sa[0:n] and Sb[0:n] will be quantized at different times. Preferably, sub-words Sa[0:n] and Sb[0:n] are provided to the digital processing circuit 104 in a synchronous manner. Therefore, the optional synchronizer consisting of a first set of latches 210 and a second set of latches 212 is provided. There is one latch for storing each bit of the sub-words, and each latch is clocked by the inactive edge of charge up pulse UP, via inverter 214. Alternately, since both UP and DOWN will have inactive edges occurring at the same time, each latch can be clocked by the inactive edge of charge down pulse DOWN.

Following is a description of circuit embodiments of the phase frequency detector 202, and of phase offset quantizer 206.

Figure 7A:
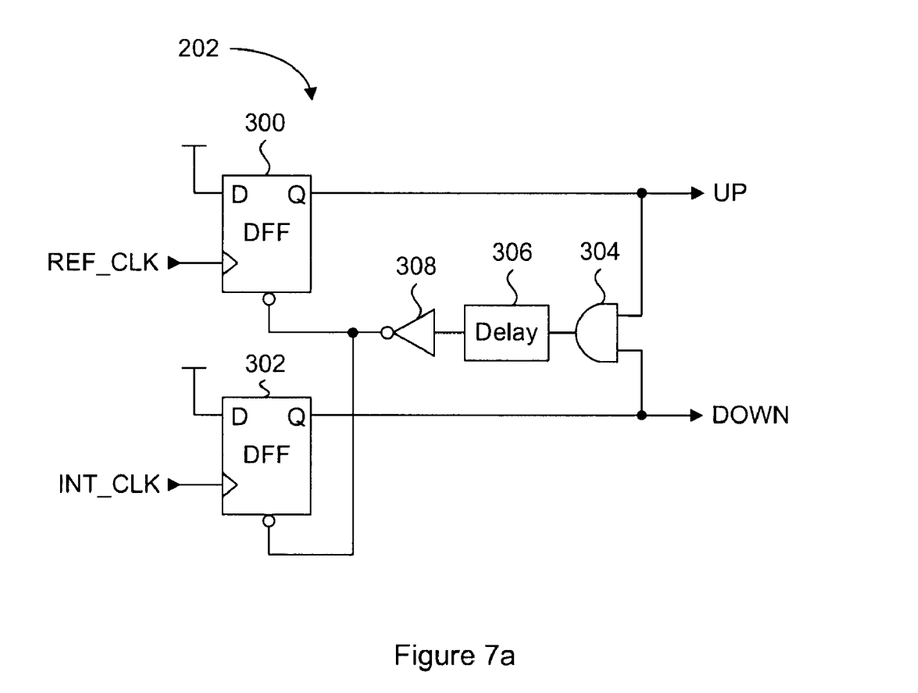
FIG. 7a is a circuit schematic of the phase frequency detector shown in FIG. 5, according to an embodiment of the present invention.

FIG. 7a is a circuit schematic of an embodiment of the phase frequency detector 202 shown in FIG. 5. Phase frequency detector 202 includes two latches 300 and 302 for generating UP and DOWN pulses respectively, and a logic circuit for resetting both latches 300 and 302 when both UP and DOWN are at the active logic level, ie. a logic "1". Latch 300 has its D input connected to VDD and its clock input connected to REF_CLK for driving UP to the active logic level through its Q output. Latch 302 has its D input connected to VDD and its clock input connected to INT_CLK for driving DOWN to the active logic level through its Q output. The logic circuit includes an AND gate 304 receiving the UP and DOWN signals, a delay circuit 306 for delaying the output of AND gate 304, and an inverter 308 for inverting the output of the delay circuit 306. The output of the inverter 306 is connected to the reset inputs of latches 300 and 302.

Figure 7B:
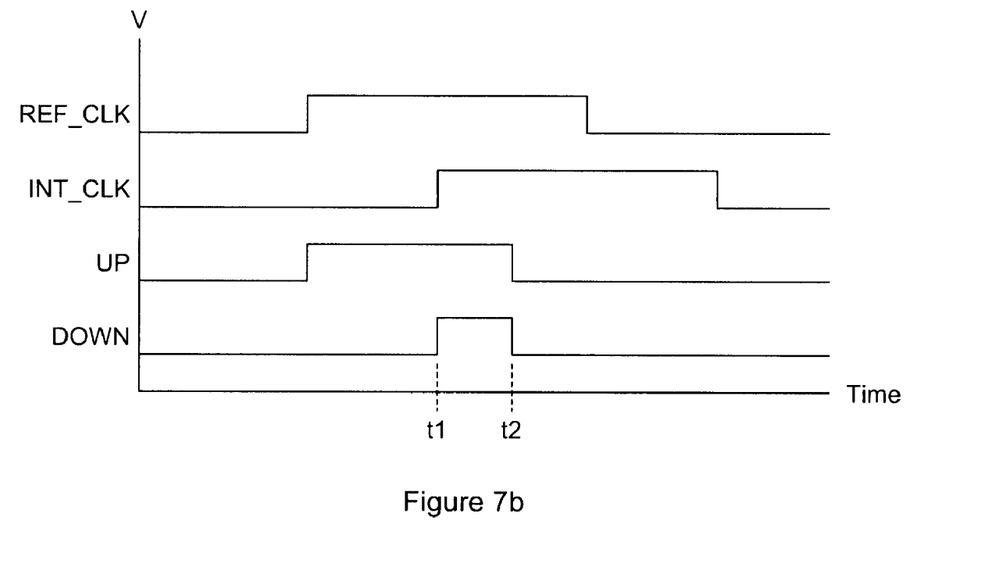

FIG. 7b is a timing diagram illustrating the operation of phase frequency detector 202. Due to the configuration of phase frequency detector 202, the rising (active) edge of UP is substantially the same as the rising edge of REF_CLK and the rising edge of DOWN is substantially the same as the rising edge of INT_CLK. The falling (inactive) edges of both UP and DOWN occur at the same time when latches 300 and 302 are reset. Since a reset occurs when both UP and DOWN are at the logic "1" state, the delay circuit 306 is added to ensure that the signal with the later rising edge has a minimum pulse duration. This minimum pulse duration is selected to be at least a time sufficient for detection by any downstream circuit.

Figure 8:
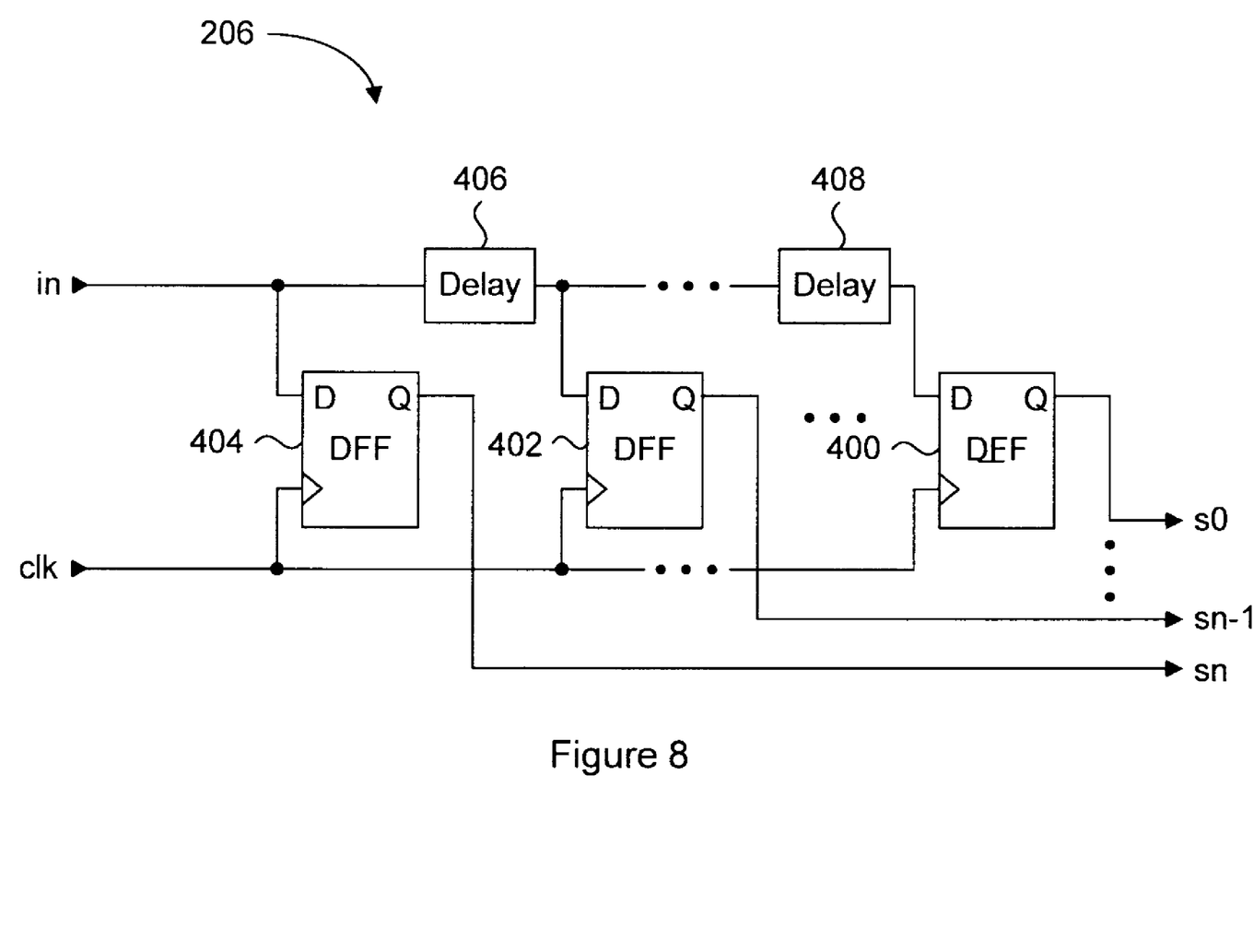
FIG. 8 is a circuit schematic of the phase offset quantizer according to an embodiment of the present invention.

FIG. 8 is a circuit schematic of the phase offset quantizer 206/208 shown in FIG. 5. Phase offset quantizer 206 has a sampling input port "in" for receiving the signal to be quantized, and a latch input "clk" for receiving the signal to initiate quantization. A series of latches 400, 402 and 404 each receives a progressively delayed version of the signal originally received at sampling input port "in". There can be up to n latches in the chain of latches, where each latch has an output port (s0 to sn) for providing one bit of the sub-word, such as sub-word Sa[0:n] for example. In the present example, the last latch 404 provides the least significant bit of the sub-word while the first latch 400 provides the most significant bit of the sub-word. Delay circuits 406 and 408 are arranged in series between the sampling input port "in" and the first latch 400, with taps after each delay circuit feeding each latch. All the latches are clocked by the signal received at latch input "clk" for simultaneous latching of the state of the signal received at their respective D-inputs.

Those skilled in the art will understand that a minimized delay of delay circuits 406 and 408 will increase the quantization resolution of the input signal. If the quantization resolution is higher, a more precise determination of the phase offset can be made. Preferably, each delay circuit 406 and 408 is implemented as a buffer having a minimized logic transition delay. An example delay value is 20 pico seconds provided by two inverter circuits connected in series.

Those skilled in the art will understand that the minimum logic transition delay provided by an inverting circuit is related to the process technology used to fabricate it. For example, an inverter circuit fabricated with a 65 nm technology will have a smaller transition delay than the same inverter circuit fabricated with a 90 nm technology. Therefore, if an advanced fabrication technology is not available, then the quantization resolution may be limited. According to another embodiment of the present invention, high resolution quantization is obtained by using at least two phase offset quantizers in parallel.

Figure 9A:
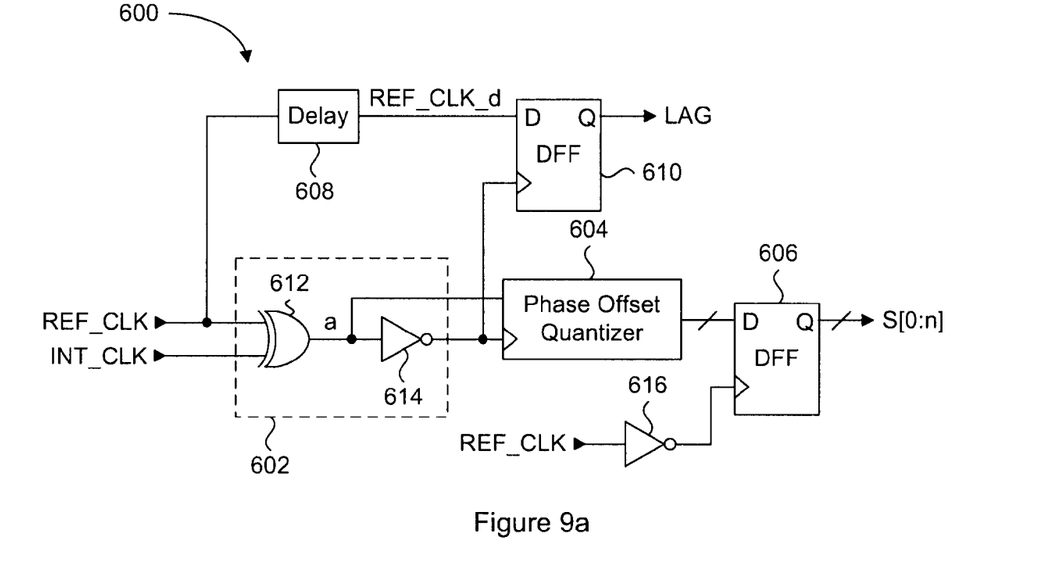
FIG. 9a is a circuit schematic of a digital charge pump according to an alternate embodiment of the present invention.

FIG. 9*a* is a circuit schematic of a digital charge pump according to an alternate embodiment of the present invention. Digital charge pump 600 includes a phase frequency detector 602 and a phase offset quantizer 604 and a latch circuit 606. An optional lag direction circuit comprising of a delay circuit 608 and a latch 610 is included. The phase offset quantizer 604 has been described with respect to the previously described embodiments. The phase frequency detector 602 includes an XOR gate 612 having first and second inputs for receiving REF_CLK and INT_CLK respectively, and an inverter 614 for providing the complement of XOR gate 612. The phase offset quantizer 604 receives the output of XOR gate 612 at its sampling input and the output of inverter 614 at its latching input. The phase output word generated by phase offset quantizer 604 can be optionally re-synchronized with latch circuit 606 in response to REF_CLK inverted by inverter 616. The phase offset word provided by latch circuit 606 is referred to as S[0:n]. The delay circuit 608 delays REF_CLK to provide REF_CLK_d, which is received by latch 610. Latch 610 latches the logic state of REF_CLK_d in response to the high logic level signal from inverter 614.

Figure 9B:
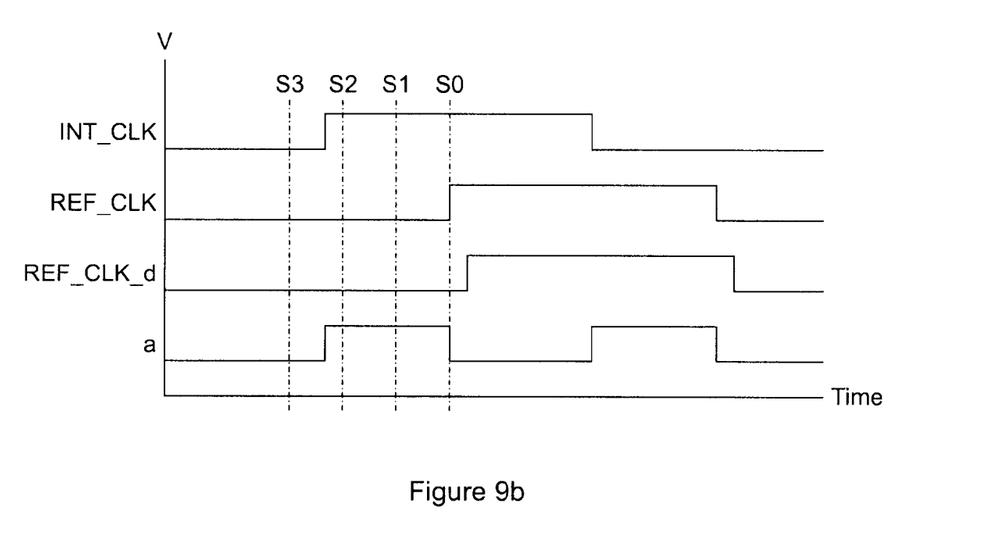

The general operation of digital charge pump 600 will now be described with reference to FIG. 9*b*, which is a timing diagram showing a signal trace for the output node "a" of XOR gate 612 relative to the signal traces for REF_CLK and INT_CLK, and a signal trace for delayed clock signal REF_CLK_d. XOR gate 612 will output a first rising edge to correspond with the rising edge of INT_CLK, and will subsequently output a falling edge to correspond with the rising edge of REF_CLK. Those skilled in the art will understand that this is an inherent operation of XOR logic. When output node "a" drops to the low logic level, the inverter 616 drives its output to the high logic level, thereby triggering phase offset quantizer 604 to latch and quantize the received input signal. In the present example, INT_CLK lags REF_CLK. It is noted that the XOR gate 612 will provide the same phase offset word when REF_CLK lags INT_CLK by the same time duration that REF_CLK lags INT_CLK. Since REF_CLK is delayed, it will be at the low logic level when node "a" drops to the low logic level. Therefore, the output LAG of latch 610 will output "0". This will be understood to mean that INT_CLK lags REF_CLK. The delay circuit is used to ensure that latch 610 has a stable logic state to latch.

Alternately, if the timing of INT_CLK and REF_CLK were swapped, then REF_CLK_d will clearly be at the high logic level when node "a" drops to the low logic level. In such a circumstance, LAG will be at the high logic level to indicate that REF_CLK lags INT_CLK. Therefore, the single bit information of LAG provides information about which signal is lagging relative to the other, and phase offset word S[0:n] provides information about the time magnitude of the lag. The logic level of LAG can be checked once upon start-up, or at different times during the locking process.

Figure 10A:
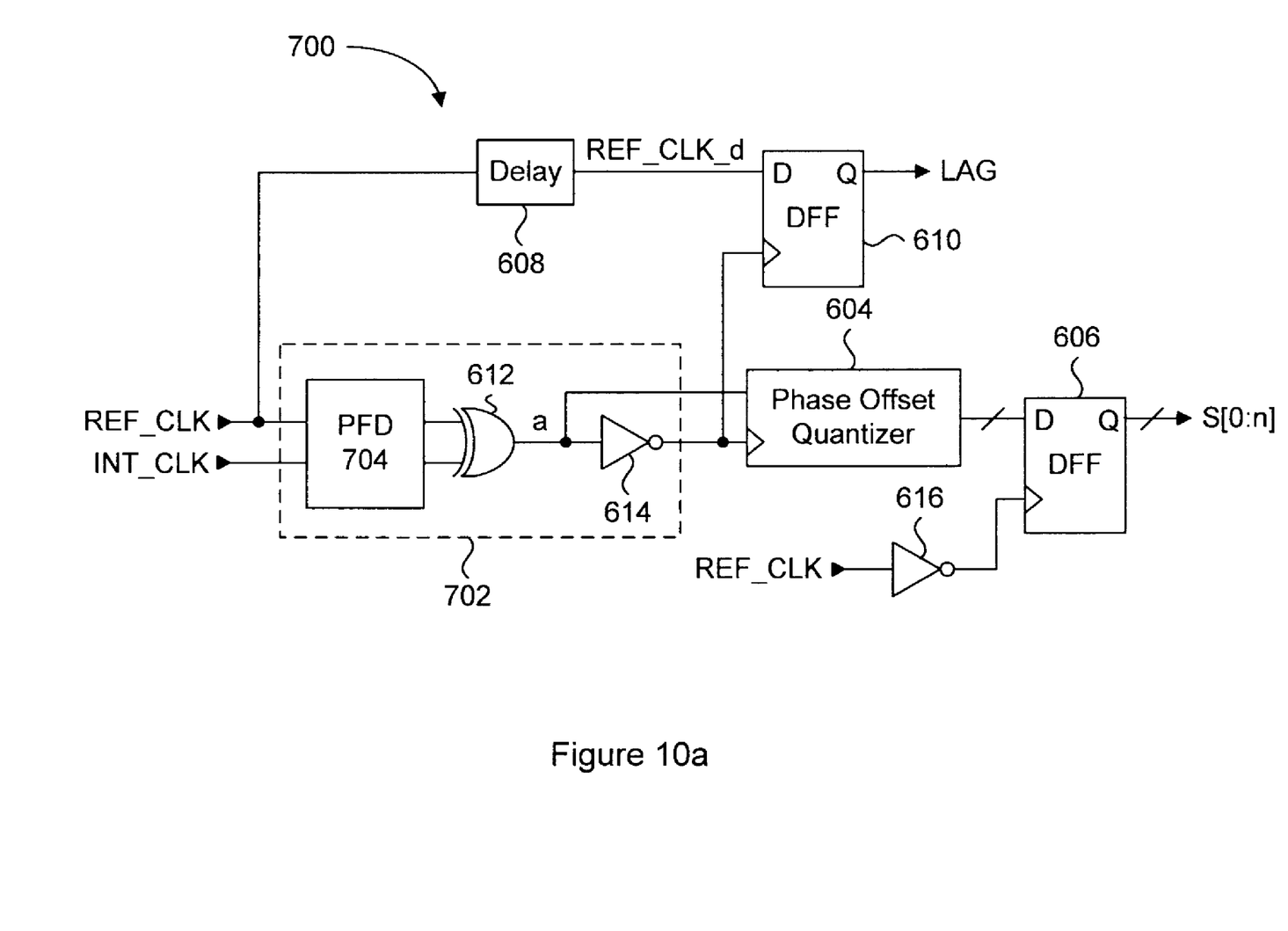

Because the phase frequency detector 602 responds directly to the logic levels of REF_CLK and INT_CLK, node "a" will rise to the high logic level again after INT_CLK drops to the low logic level while REF_CLK is at the low logic level. This can contribute to unnecessary power consumption as the circuits are triggered to switch on and off even though the next sampling of REF_CLK and INT_CLK have yet to occur. FIG. 10 is an alternate embodiment of the digital charge pump shown in FIG. 9*a*, which will obviate this problem.

Figure 10B:
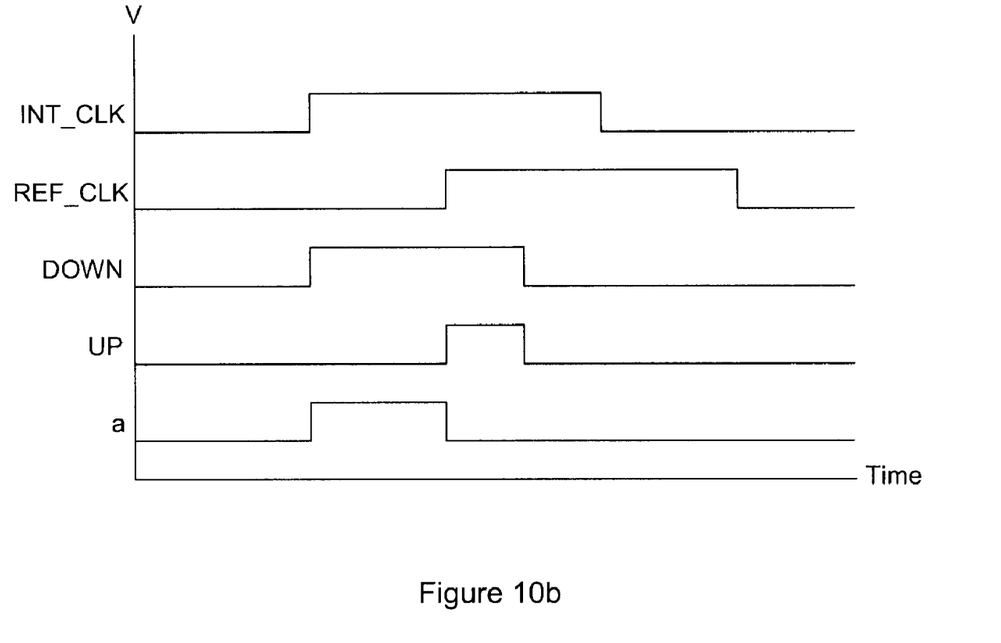

All the components of digital charge pump 700 of FIG. 10 are identical to digital charge pump 600 of FIG. 9*a* except that phase frequency detector 602 is replaced with a phase frequency detector 702. Phase frequency detector 702 includes a phase detector 704, XOR gate 612 and inverter 614. In otherwords, phase frequency detector 702 adds the phase detector 704 between the XOR gate 612 and clocks REF_CLK and INT_CLK. Phase detector 704 can be implemented with the same circuit configuration shown in FIG. 7*a* for example, to generate the UP and DOWN signals in response to REF_CLK and INT_CLK. In the embodiment of FIG. 10, signals UP and DOWN provided by phase detector 704 are received by XOR gate 612. FIG. 10*b* is a timing diagram showing a signal trace for the output node "a" of XOR gate 612 relative to the signal traces for UP and DOWN, and clocks REF_CLK and INT_CLK. Therefore, phase detector 704 will eventually drive both signals UP and DOWN to the low logic level, thereby preventing node "a" from rising to the high logic level again, at least until the next rising edges of REF_CLK and INT_CLK. In this embodiment, REF_CLK is provided to delay 608, but signal UP corresponding to REF_CLK can be used instead with equal effectiveness for determining which clock lags with respect to the other.

As shown in the previously disclosed embodiments of the present invention, the digital charge pump circuit can provide a digital phase offset word corresponding to a difference in phase between an internal clock provided by a VCO, and a reference clock. As the phase offset is digitized, digital processing can convert the phase offset word into control signals for adjusting the VCO, and consequently its output frequency.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A digital phase lock loop circuit comprising:
   a voltage controlled oscillator for providing an output clock signal having a first frequency in response to control signals;
   a divider for converting the output clock signal into an internal clock signal having a second frequency;
   a digital charge pump circuit for generating a phase offset word corresponding to a difference in phase between the internal clock signal and a reference clock signal, the digital charge pump circuit including
      a quantizing circuit for generating the phase offset word in response to a phase difference between active edges of the internal clock signal and the reference clock signal;
      a phase frequency detector for providing a first signal from a first output terminal and a second signal from a second output terminal, the phase frequency detector including logic circuitry for driving the first signal to an active logic level in response to an earliest active edge between the reference clock signal and the internal clock signal, the first signal being driven to an inactive logic level in response to a latest active edge between the reference clock signal and the internal clock signal, the difference in time between the earliest active edge and the latest active edge corresponding to the phase difference between the internal clock signal and the reference clock signal, the logic circuitry including
         an XOR gate having a first input for receiving the reference clock signal, a second input for receiving the internal clock signal, and a first output corresponding to the first output terminal, and
         an inverter having a third input connected to the first output and a second output corresponding to the second output terminal; and,
   a digital processing circuit for receiving the phase offset word and for generating the control signals in response to the phase offset word.

2. The digital phase lock loop circuit of claim 1, wherein the quantizing circuit includes
   a first phase offset quantizer having a first sampling input for receiving a first signal corresponding to the reference clock signal and a first latch input for receiving a second signal corresponding to the internal clock signal, the first phase offset quantizer digitizing the first signal received at the sampling input into a first sub-word in response to an active edge of the second signal, and
   a second phase offset quantizer having a second sampling input for receiving the second signal and a second latch input for receiving the first signal, the second phase offset quantizer digitizing the second signal received at the sampling input into a second sub-word in response to an active edge of the first signal, the phase offset word corresponding to the first sub-word and the second sub-word.

3. The digital phase lock loop circuit of claim 1, further including a lag direction circuit for providing data corresponding to a lag of the reference clock signal relative to the internal clock signal.

4. The digital phase lock loop circuit of claim 1, wherein the quantizing circuit includes a phase offset quantizer having a sampling input for receiving the first output and a latch input for receiving the second output, the phase offset quantizer digitizing the first output received at the sampling input into the phase offset word in response to the second output.

5. A digital phase lock loop circuit comprising:
   a voltage controlled oscillator for providing an output clock signal having a first frequency in response to control signals;
   a divider for converting the output clock signal into an internal clock signal having a second frequency;
   a digital charge pump circuit for generating a phase offset word corresponding to a difference in phase between the internal clock signal and a reference clock signal, the digital charge pump circuit including
      a quantizing circuit for generating the phase offset word in response to a phase difference between active edges of the internal clock signal and the reference clock signal;
      a phase frequency detector for providing a first signal from a first output terminal and a second signal from a second output terminal, the phase frequency detector including logic circuitry for driving the first signal to an active logic level in response to an earliest active edge between the reference clock signal and the internal clock signal, the first signal being driven to an inactive logic level in response to a latest active edge between the reference clock signal and the internal clock signal, the difference in time between the earliest active edge and the latest active edge corresponding to the phase difference between the internal clock signal and the reference clock signal, the logic circuitry including
         a phase detector having the first output terminal for providing the first signal in response to the reference clock signal, and having the second output terminal for providing the second signal in response to the internal clock signal, the first signal having an active edge corresponding to an active edge of the reference clock signal, and the second signal having an active edge corresponding to an active edge of the internal clock signal, an XOR gate having a first input for receiving the first signal, a second input for receiving the second signal, and a first output corresponding to the first output terminal, and an inverter having a third input connected to the first output and a second output corresponding to the second output terminal; and, a digital processing circuit for receiving the phase offset word and for generating the control signals in response to the phase offset word.

6. A digital charge pump circuit comprising:

a quantizing circuit for generating a phase offset word in response to a phase difference between active edges of a first signal and a second signal; and, a phase frequency detector for providing the first signal from a first output terminal in response to a reference clock and the second signal from a second output terminal in response to an internal clock, the first signal having an active edge corresponding to an active edge of the reference clock, and the second signal having an active edge corresponding to an active edge of the internal clock, the phase frequency detector including a first latch for driving the first signal to an active logic level in response to the active edge of the reference clock, a second latch for driving the second signal to the active logic level in response to the active edge of the internal clock, and a logic circuit for resetting the first latch and the second latch when both the first signal and the second signal are at the active logic level, the logic circuit including a delay circuit for delaying resetting of the first latch and the second latch for a predetermined period of time.

7. The digital charge pump circuit of claim 6, further including a lag direction circuit for providing data corresponding to a lag of the reference clock relative to the internal clock.

8. The digital charge pump circuit of claim 7, wherein the lag direction circuit includes a delay circuit for receiving one of the reference clock and the internal clock, and for providing a delayed clock signal, a third latch for latching the delayed clock signal in response to the second output being at the active logic level when both the internal clock and the reference clock are at the active logic level.

9. A digital charge pump circuit comprising:

a quantizing circuit for generating a phase offset word in response to a phase difference between active edges of a first signal and a second signal; and, a phase frequency detector for providing the first signal from a first output terminal in response to a reference clock and the second signal from a second output terminal in response to an internal clock, the first signal having an active edge corresponding to an active edge of the reference clock, and the second signal having an active edge corresponding to an active edge of the internal clock, the phase frequency detector including logic circuitry for driving the first signal to an active logic level in response to an earliest active edge between the reference clock and the internal clock, the first signal being driven to an inactive logic level in response to a latest active edge between the reference clock and the internal clock, the logic circuitry including an XOR gate having a first input for receiving the reference clock, a second input for receiving the internal clock, and a first output corresponding to the first output terminal, and an inverter having a third input connected to the first output and a second output corresponding to the second output terminal.

10. The digital charge pump circuit of claim 9, further including a lag direction circuit for providing data corresponding to a lag of the reference clock relative to the internal clock.

11. A digital charge pump circuit comprising:

a quantizing circuit for generating a phase offset word in response to a phase difference between active edges of a first signal and a second signal; and, a phase frequency detector for providing the first signal from a first output terminal in response to a reference clock and the second signal from a second output terminal in response to an internal clock, the first signal having an active edge corresponding to an active edge of the reference clock, and the second signal having an active edge corresponding to an active edge of the internal clock, the phase frequency detector including logic circuitry for driving the first signal to an active logic level in response to an earliest active edge between the reference clock and the internal clock, the first signal being driven to an inactive logic level in response to a latest active edge between the reference clock and the internal clock, the logic circuitry including a phase detector having the first output terminal for providing the first signal in response to the reference clock, and having the second output terminal for providing the second signal in response to the internal clock, the first signal having an active edge corresponding to an active edge of the reference clock, and the second signal having an active edge corresponding to an active edge of the internal clock, an XOR gate having a first input for receiving the first signal, a second input for receiving the second signal, and a first output corresponding to the first output terminal, and an inverter having a third input connected to the first output and a second output corresponding to the second output terminal.

12. The digital charge pump circuit of claim 11, further including a lag direction circuit for providing data corresponding to a lag of the reference clock relative to the internal clock.

13. The digital charge pump circuit of claim 12, wherein the lag direction circuit includes a delay circuit for receiving one of the first signal and the second signal, and for providing a delayed clock signal, a latch for latching the delayed clock signal in response to the second output being at the active logic level when both the first signal and the second are at the active logic level.

14. The digital charge pump circuit of claim 9, wherein the quantizing circuit includes a phase offset quantizer having a sampling input for receiving the first output and a latch input for receiving the second output, the phase offset quantizer quantizing the first output received at the sampling input into the phase offset word in response to the second output.

15. A digital charge pump circuit comprising:

a quantizing circuit for generating a phase offset word in response to a phase difference between active edges of a first signal and a second signal, the quantizing circuit including;

a first phase offset quantizer having a first sampling input for receiving the first signal and a first latch input for receiving the second signal, the first phase offset quantizer quantizing the first signal received at the sampling input into a first sub-word in response to an active edge of the second signal, and a second phase offset quantizer having a second sampling input for receiving the second signal and a second latch input for receiving the first signal, the second phase offset quantizer quantizing the second signal received at the sampling input into a second sub-word in response to an active edge of the first signal, the phase offset word corresponding to the first sub-word and the second sub-word; and, a phase frequency detector for providing the first signal from a first output terminal in response to a reference clock and the second signal from a second output terminal in response to an internal clock, the first signal having an active edge corresponding to an active edge of the reference clock, and the second signal having an active edge corresponding to an active edge of the internal clock.

16. The digital charge pump circuit of claim 6, wherein the first signal is a charge up pulse and the second signal is a charge down pulse, the charge up pulse and the charge down pulse being generated by the phase frequency detector.

17. A digital charge pump circuit comprising:
a quantizing circuit for generating a phase offset word in response to a phase difference between active edges of a first signal and a second signal, the first signal being provided from an XOR gate receiving a reference clock and an internal clock, and the second signal is a complement of the first signal; and, a phase frequency detector for providing the first signal from a first output terminal in response to the reference clock and the second signal from a second output terminal in response to the internal clock, the first signal having an active edge corresponding to an active edge of the reference clock, and the second signal having an active edge corresponding to an active edge of the internal clock.

18. A digital charge pump circuit comprising:
a quantizing circuit for generating a phase offset word in response to a phase difference between active edges of a first signal and a second signal, the quantizing circuit including a synchronizer for receiving the phase offset word and for providing the phase offset word synchronously with a clock signal; and, a phase frequency detector for providing the first signal from a first output terminal in response to a reference clock and the second signal from a second output terminal in response to an internal clock, the first signal having an active edge corresponding to an active edge of the reference clock, and the second signal having an active edge corresponding to an active edge of the internal clock.

19. A digital phase lock loop circuit including a digital charge pump circuit and a voltage controlled oscillator characterized in that:

the digital charge pump circuit generates a phase offset word corresponding to a difference in phase between two clock signals, the two clock signals including a reference clock signal and an internal clock signal, the digital charge pump circuit including
a quantizing circuit for generating the phase offset word in response to a phase difference between active edges of a first signal and a second signal; and,
an output of the voltage controlled oscillator is controlled by the phase offset word.

20. The digital phase lock loop circuit of claim 19, further comprising a digital processing circuit for receiving the phase offset word and for generating control signals in response to the phase offset word, the control signals controlling the output of the voltage controlled oscillator.

21. The digital phase lock loop circuit of claim 19, wherein the digital charge pump circuit further includes a phase frequency detector for providing the first signal from a first output terminal in response to the reference clock signal and the second signal from a second output terminal in response to the internal clock signal, the first signal having an active edge corresponding to an active edge of the reference clock signal, and the second signal having an active edge corresponding to an active edge of the internal clock signal.

22. The digital phase lock loop circuit of claim 21, further comprising a divider for converting the output of the voltage controlled oscillator into the internal clock.

* * * * *